United States Patent [19]

Sieborger

[11] Patent Number: 4,941,080
[45] Date of Patent: Jul. 10, 1990

[54] FULL WAVE RECTIFIER CIRCUIT

[75] Inventor: Günther H. K. O. Sieborger, Schenefeld, Fed. Rep. of Germany

[73] Assignee: U.S. Philips Corporation, New York, N.Y.

[21] Appl. No.: 407,375

[22] Filed: Sep. 14, 1989

[30] Foreign Application Priority Data

Sep. 16, 1988 [DE] Fed. Rep. of Germany ....... 3831454

[51] Int. Cl.[5] ..................... G01R 19/22; G08C 13/00
[52] U.S. Cl. .................................. 363/127; 307/261; 328/26; 323/316
[58] Field of Search ............... 363/126, 127; 323/311, 323/313, 315, 316; 307/261; 328/26

[56] References Cited

U.S. PATENT DOCUMENTS

| | | | |
|---|---|---|---|
| 4,053,796 | 10/1977 | van de Plassche | 363/127 |
| 4,158,882 | 6/1979 | Citta | 363/127 |
| 4,333,141 | 6/1982 | Nagano | 363/127 |
| 4,336,586 | 6/1982 | Lunn | 328/26 |
| 4,360,866 | 11/1982 | Main et al. | 328/26 |
| 4,445,054 | 4/1984 | Ishii | 363/127 |
| 4,501,933 | 2/1985 | Sihgoni et al. | 363/127 |
| 4,523,105 | 6/1985 | Jose et al. | 307/261 |
| 4,575,643 | 3/1986 | Sakai | 307/261 |
| 4,685,048 | 8/1987 | Tazaki | 363/127 |
| 4,745,395 | 5/1988 | Robinson | 363/127 |

Primary Examiner—Peter S. Wong
Attorney, Agent, or Firm—Bernard Franzblau

[57] ABSTRACT

A full wave rectifier circuit comprising a differential amplifier which drives a rectifier stage via a driver stage and to which negative feedback is applied. A signal current to be rectified is applied to an input of the differential amplifier. This current flows directly to the output of the rectifier stage during one half-cycle and is applied to said rectifier stage via a first current mirror during the other half-cycle. The supply current of this current mirror together with the supply current of the driver stage are delivered by a current source. A reduction of the voltage offset is obtained in that the current source is a controllable current source, which is controlled by a current derived from the output current of the first current mirror in such a way that the supply current of the current mirror corresponds to the varition in the current from the current source caused by the control action.

12 Claims, 1 Drawing Sheet

FULL WAVE RECTIFIER CIRCUIT

BACKGROUND OF THE INVENTION

This invention relates to a fullwave rectifier circuit comprising a signal input for receiving an input signal current to be rectified, which signal input is coupled to a signal output via a rectifier stage, said stage comprising a semiconductor junction for conduction of the input signal during one half-cycle of the current and a first current mirror for mirroring the input signal current during the other half-cycle of the current to the signal output, a differential amplifier having an input coupled to the input of the rectifier stage and having its output negatively fed back via a driver stage to the input of the rectifier stage, and a current source for supplying the supply currents of the driver stage and the first current mirror.

Such a full wave rectifier circuit forms a part of the known integrated circuit TEA 0652. FIG. 1 shows a circuit diagram of this circuit. In this diagram a differential amplifier 1 has an input connected to a reference voltage $V_R$ and has its output connected to the input of a driver stage. The driver stage comprises an npn transistor $Q_{16}$ whose emitter is connected to the negative supply voltage terminal and whose collector is connected to the base of a transistor $Q_{11}$, whose emitter is connected to a further input of the differential amplifier 1 to provide negative feedback. This input, i.e. the emitter of the transistor $Q_{11}$, receives the signal current to be rectified from a signal input 2. In addition to the transistor $Q_{11}$ the rectifier stage comprises a current mirror 3, which has its input connected to the input 2 and which has its output connected to the collector of the transistor $Q_{11}$, which constitutes the rectifier output or is coupled thereto.

The supply current for the current mirror 3 is furnished by a direct current source which is connected to the collector of the transistor $Q_{16}$ via a diode $Q_{15}$. This, the direct current source supplies both the supply current for the current mirror 3 (which supply current corresponds to the sum of the currents flowing into and out of the current mirror) and the supply current for the driver stage $Q_{15}$, $Q_{16}$.

The prior-art circuit operates as follows. If the signal current applied to the input 2 has a positive polarity the signal current will flow to the rectifier output 5 of the circuit via the collector emitter path of the transistor $Q_{11}$. For this polarity of the input current no current will flow in the current mirror 3. In the case of a negative polarity the signal current flows to the positive supply voltage terminal via the input of the current mirror 3 and the current source 4, causing a current of the same polarity as during the positive half-cycle to flow from the output of the current mirror 3 to the output 5. This results in current half-cycles of the same polarity appearing on the output 5 in the case of an alternating polarity of the current at the input 2, which corresponds to full wave rectification.

The current supplied by the current source 4 should be at least slightly larger than the current supplied by the current mirror 3 in the case of a signal current of negative polarity and maximal amplitude, in order to ensure that the driver stage $Q_{15}$, $Q_{16}$ does not become currentless and that the negative feedback loop comprising the differential amplifier 1, the driver stage and the transistor $Q_{11}$ remains operative, which loop pulls the potential on the two differential amplifier inputs towards the same value (i.e. the reference voltage $V_R$). In the case of a positive polarity of the signal current, the entire current supplied by the direct current source 4 flows via the driver stage $Q_{15}$ and $Q_{16}$. Consequently, this current is substantially larger than during the negative half-cycle and requires a correspondingly large base current. Such a base current implies a voltage offset on the input of the differential amplifier, i.e. in the case of a positive polarity of the input current the potentials on the two inputs of the differential amplifier can no longer be identical. This voltage offset results in unequal half cycles (of the same polarity) appearing on the output 5 of the rectifier stage, in particular in the case of small signal currents having equal current half cycles on the input 2. This distortion is undesirable, in particular if the rectified signal is used as a control signal in a rapidly responding control circuit.

SUMMARY OF THE INVENTION

It is an object of the present invention to provide a full wave rectifier of the type defined in the opening paragraph which at least mitigates this problem. According to the invention this object is achieved in that the current source is controllable as a function of the output current of the first current mirror for supplying a current which deviates from a constant value to an amount equal to the current needed by the first current mirror.

In accordance with the invention the supply current is supplied by a controllable current source, which is controlled in such a way that the current variation caused by the control action exactly corresponds to the supply current which is required by the current mirror 3 and which depends on the input signal amplitude. The direct current through the driver stage is then constant and can be adjusted to such a small value that the corresponding offset voltages required on the input of the differential amplifier 1 are at least reduced substantially, if not compensated for completely.

The controllable current source should supply the constant supply current for the driver stage and the variable supply current for the current mirror. In a further embodiment of the invention, this can be achieved in a very simple manner in that the controllable current source comprises a constant current source and the output branch of a second current mirror having one input coupled to the output of a third current mirror which third current mirror has its input connected to an output of the first current mirror.

Thus, the output of the second current mirror supplies the supply current for the first current mirror and the constant current source supplies the supply current for the driver stage.

If the differential amplifier comprises bipolar input transistors whose bases constitute the input of the differential amplifier, the input current of the differential amplifier is not negligible and may give rise to an additional voltage offset. In a further embodiment of the invention this is precluded in that the differential amplifier comprises bipolar input transistors, whose bases constitute the inputs of the differential amplifier, and in that the base of the input transistor ($Q_{19}$), which is coupled to the signal input, is coupled to the output of a fourth current mirror (8), whose input is coupled to the base of a transistor ($Q_4$) whose emitter current is proportional to the emitter current of the input transistor. The fourth current mirror then supplies exactly the base current for the input transistor so that said voltage offset is avoided.

BRIEF DESCRIPTION OF THE DRAWINGS

The invention will now be described in more detail, by way of example, with reference to the drawings. In the drawings.

DESCRIPTION OF THE PREFERRED EMBODIMENTS

Figure 2:
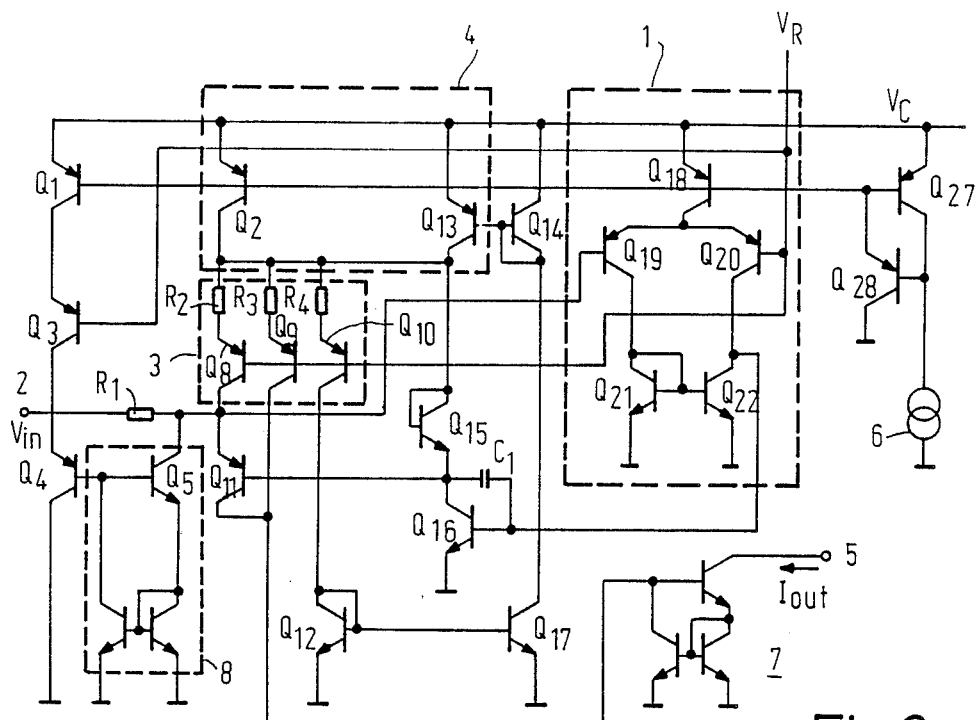
FIG. 2 is a circuit diagram of an embodiment of the invention.
Figure 1:
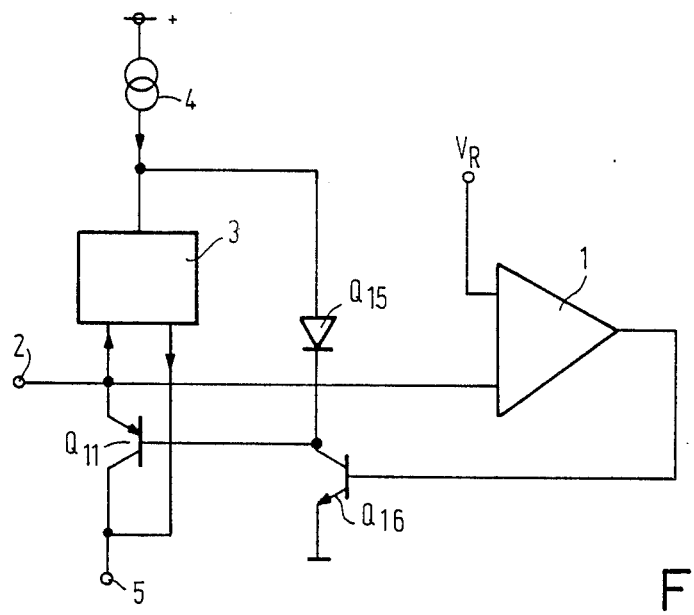
FIG. 1 is a block diagram of the prior-art circuit.

Components in FIG. 2 whose function in principle corresponds to those of the components in FIG. 1 bear the same reference numerals.

The differential amplifier 1 is constituted by an input stage of a type which is customary in operational amplifiers. It comprises a pnp transistor $Q_{18}$ whose emitter is connected to the positive supply voltage and whose collector is connected to the interconnected emitters of two transistors $Q_{19}$ and $Q_{20}$. The base emitter path of the transistor $Q_{18}$ is arranged in parallel with the base emitter path of a transistor $Q_{27}$, to whose collector emitter path a direct current of, for example, 10 $\mu$A is applied by means of a transistor $Q_{28}$ and a direct current source 6. If the transistor geometries are indentical the transistor $Q_{18}$ carries the same direct current, which is divided equally between the transistors $Q_{19}$ and $Q_{20}$. The base of the transistor $Q_{20}$ is connected to a reference voltage $V_R$, which corresponds for example to half the supply voltage. The base of the transistor $Q_{19}$ is connected to the input of the full wave rectifier 2 by a resistor $R_1$ which may have a value of a few kOhms. A signal voltage to be rectified is applied to said input 2 of the full wave rectifier. The collectors of the transistors $Q_{19}$ and $Q_{20}$ are connected to the input and the output respectively of a current mirror comprising the npn transistors $Q_{21}$ and $Q_{22}$.

The output of the differential amplifier 1, which output is constituted by the node between the collectors of the transistors $Q_{20}$ and $Q_{22}$, is connected to the base of the transistor $Q_{16}$ of the driver stage, whose collector-base path is shunted by a capacitor $C_1$ of, for example, 15 pF in order to guarantee the stability of the loop. When the base current of the driver transistor $Q_{16}$ is equal to twice the base current of the transistor $Q_{21}$ or $Q_{22}$, the base direct current for the stage $Q_{16}$ is generated exactly when the base connections of the transistors $Q_{19}$ and $Q_{20}$ are at the same potential.

The transistor $Q_{11}$, which has its base connected to the collector of $Q_{16}$ and its emitter to the base of the transistor $Q_{19}$, completes a negative feedback loop, which ensures that the potential on the base of $Q_{19}$ follows the potential on the base of $Q_{20}$. The node between the emitter of the transistor $Q_{11}$ and the base of $Q_{19}$ thus acts as a virtual zero point, i.e. as though said node were connected to a (low impedance) direct voltage source of a voltage $V_R$. Consequently, the signal voltage on the input 2 is converted into a signal current.

The current mirror 3 comprises a pnp transistor $Q_8$, which has its collector connected to the emitter of $Q_{11}$ and its emitter, via a resistor $R_2$ of for example 4.7 kOhms, to the output of the current source 4. The base of the transistor $Q_8$ is connected to the reference voltage $V_R$ and to the base of a further pnp transistor $Q_9$ having the same transistor geometry and having its emitter connected to the output of the current source via a resistor $R_3$ of the same value as $R_2$. The collector of the transistor $Q_9$ is connected to the collector of the transistor $Q_{11}$ and the node common to these collectors is connected to the input of a current mirror 7, whose output also constitutes the output of the full wave rectifier.

For a positive half cycle (relative to the reference voltage $V_R$) of the signal voltage on the input 2 the transistor $Q_{11}$ is conductive and feeds the current through the resistor $R_1$ to the current mirror 7. The diode $Q_{15}$ then pulls down the potential on the output of the current source 4 so far that the transistors $Q_8$ and $Q_9$ are cut off during the positive half-cycle.

During the negative half-cycle of the signal voltage on the input the potential on the output of the current source 4 changes exactly to such an extent that the entire signal current flowing through the resistor $R_1$ can flow to the current source 4 via the transistor $Q_8$. As a result of this a current of the same value will flow to the current mirror 7 via the transistor $Q_8$. During the negative half cycle the input current consequently flows into the unit 3, which supplies an equal output current. Consequently, the unit 3, in conjunction with the current source 4 and the associated circuitry, acts as a current mirror. It is therefore referred to as a current mirror, although—considered by itself—it does not constitute a conventional current mirror.

The current source 4 comprises a pnp transistor $Q_2$, whose base emitter path is connected in parallel with that of the transistor $Q_{18}$. The collector of the transistor $Q_2$ is connected to the output of the current source. If the transistors $Q_2$ and $Q_{18}$ have the same transistor geometry the transistor $Q_2$ will supply a direct current corresponding to the direct current supplied by the transistor $Q_{18}$ and equal to twice the direct currents through the transistors $Q_{19}$ and $Q_{20}$.

In addition, the current source 4 comprises a pnp transistor $Q_{13}$, whose emitter is connected to the positive supply voltage and whose collector is connected to the output of the current source. The base of the transistor $Q_{13}$ is controlled in such a way that it is capable of exactly delivering the supply current for the current mirror 3. For this purpose the base/emitter path of the transistor $Q_{13}$ is arranged in parallel with the base emitter path of a diode connected pnp transistor $Q_{14}$ so that the transistors $Q_{13}$ and $Q_{14}$ form a current mirror whose output is connected to the output of the current source 4 and whose input is connected to the output of a further current mirror, comprising the npn transistors $Q_{12}$ and $Q_{17}$. The input of this further current mirror, i.e. the diode connected transistor $Q_{12}$ is connected to the collector of a pnp transistor $Q_{10}$, whose base is connected to the bases of the transistors $Q_8$ and $Q_9$ and whose emitter is connected to the output of the current source 4 by a resistor $R_4$ of the same value as the resistors $R_2$ and $R_3$. Thus, the transistor $Q_{10}$ forms a second output of the current mirror 3.

The current source 4 is controlled as follows.

In the case of a positive voltage half cycle on the input 2, all of the transistors in the current mirror 3 remain currentless. Consequently, there will be no current in the transistor $Q_{13}$ and only the transistor $Q_2$ will carry a direct current which flows completely via the driver stage $Q_{16}$, $Q_{15}$ and which is so large (twice as large as the direct current through one of the transistors $Q_{19}$ and $Q_{20}$) that the differential amplifier 1 can supply this current without voltage offset. Consequently the potentials on the two inputs of the differential amplifier are then identical.

In the case of a negative signal voltage half cycle on the input 2 the entire signal current will flow through the transistor $Q_8$ of the current mirror. For an input signal of 1 V or higher this current will be larger than 200 µA and is consequently substantially larger than the direct current supplied by the transistor $Q_2$ (in the present example 10 µA). The supply current of the current mirror is then three times as large as the current through the transistor $Q_8$, because the current in the transistors $Q_1$ and $Q_{10}$ is the same as the current in the transistor $Q_8$. For this purpose the current mirror ratio of one of the current mirrors $Q_{12}$, $Q_{17}$ and $Q_{13}$, $Q_{14}$, preferably that of the current mirror $Q_{12}$, $Q_{17}$, is 1:3, i.e. the transistor $Q_{17}$ supplies a current which is three times as large as the current flowing into the transistor $Q_{12}$, which is achieved in known manner by a suitable choice of the size of the emitter areas of these transistors. As a result of this the transistor $Q_{13}$ supplies a direct current which is three times as large as the current supplied by the transistor $Q_{10}$, which consequently provides the entire supply current for the current mirror 3. Moreover only the direct current supplied by the transistor $Q_2$ then flows via the driver stage, so that there can be no offset on the input of the differential amplifier.

The base current of the input transistor $Q_{19}$ of the amplifier 1 flows via the resistor $R_1$. For the negative half-cycle the potential on the base of $Q_{19}$ is therefore offset in conformity with the voltage drop produced across the resistor $R_1$ by the base current, which corresponds to a voltage offset of some tenths of mV. This undesirable voltage offset is minimal because the input current of the differential amplifier 1 is minimised by a Darlington arrangement at the input of this amplifier. In the circuit shown in FIG. 2 this is achieved in a different way.

For this purpose the circuit comprises three pnp transistors $Q_1$, $Q_3$, $Q_4$ whose collector-emitter paths are arranged in series between ground and the positive supply terminal. The base of the transistor $Q_1$ is connected to the base of the transistor $Q_{18}$, so that both transistors carry the same collector current, which is twice as large as the collector current of the transistor $Q_{19}$. This collector current is applied to the emitter of the transistor $Q_4$ via the transistor $Q_3$ and is drained to ground via the collector of said transistor $Q_4$. The base current of the transistor $Q_4$, which is twice as large as the base current of the transistor $Q_{19}$, is applied to the input of a current mirror 8. By an appropriate choice of the transistor geometry it is achieved that the output current of this current mirror is only half the input current. This output current is applied to the base of the transistor $Q_{19}$. Consequently, it corresponds to the required base current.

I claim:

1. A fullwave rectifier circuit comprising; a signal input for receiving an input signal current to be rectified, means coupling said signal input to a signal output via a rectifier stage, said rectifier stage comprising a semiconductor junction for conduction of the input signal current during one half-cycle of the current and a first current mirror for mirroring the input signal current during the other half-cycle of the current to the signal output, a differential amplifier having an input coupled to the input of the rectifier stage and having its output negatively fed back via a driver stage to the input of the rectifier stage, and a current source for supplying the supply currents of the driver stage and the first current mirror, characterized in that the current source is controllable in response to the output current of the first current mirror for supplying a current which deviates from a constant value by an amount equal to the current needed by the first current mirror.

2. A circuit as claimed in claim 1, wherein the controllable current source comprises a constant current source and an output of a second current mirror having one input coupled to an output of a third current mirror said third current mirror having its input connected to an output of the first current mirror.

3. A circuit as claimed in claim 2 wherein an input of the differential amplifier, which acts as a virtual zero point, is connected to the signal input via a resistor.

4. A circuit as claimed in claim 2, wherein the differential amplifier comprises first and second bipolar input transistors, whose bases constitute the inputs of the differential amplifier, and the base of the first input transistor, which is coupled to the signal input, is coupled to an output of a fourth current mirror, whose input is coupled to a base of a transistor whose emitter current is proportional to the emitter current of said first input transistor.

5. A circuit as claimed in claim 1, wherein the differential amplifier comprises bipolar input transistors, whose bases constitute the inputs of the differential amplifier, and in that the base of one differential input transistor amplifier, which is coupled to the signal input, is coupled to the output of a fourth current mirror, whose input is coupled to a base of a transistor whose emitter current is proportional to the emitter current of said one input transistor.

6. A circuit as claimed in claim 5, wherein the first current mirror comprises at least two transistors, whose emitters are connected to an output of the controllable current source via resistors of equal value and whose bases are connected to the same direct voltage, and wherein a collector of one of said transistors constitutes the input of the first current mirror and which is coupled to the signal input and the collector of the other transistor forms and output of the first current mirror.

7. A circuit as claimed in claim 1, wherein the first current mirror comprises at least two transistors, whose emitters are connected to an output of the controllable current source via resistors of equal value and whose bases are connected to the same direct voltage, and in that a collector of one of said transistors constitutes the input of the first current mirror and which is coupled to the signal input and a collector of the other transistor forms an output of the first current 8. A circuit as claimed in claim 1 wherein an input of the differential amplifier, which acts as a virtual zero point, is connected to the signal input via a resistor.

9. A fullwave rectifier circuit as claimed in claim 1 further comprising: a second current mirror and a third current mirror each having an input branch and an output branch, wherein said controllable current source comprises a constant current source connected in parallel with the output branch of the second current mirror, means coupling the input branch of the second current mirror to the output branch of the third current mirror and the input branch of the third current mirror to an output of the first current mirror, said first current mirror comprising first and second transistors each having a first main electrode coupled to an output of the controllable current source via respective first and second resistors of the same resistance value, a source of direct voltage, means coupling respective control electrodes of said first and second transistors to said source of direct voltage, and wherein a second main electrode of the second transistor forms the output of the first current mirror and a second main electrode of the first transistor forms an input of the first current mirror, said input of the first current mirror being coupled to the signal input of the fullwave rectifier circuit.

10. A fullwave rectifier circuit as claimed in claim 1 wherein said driver stage comprises a diode element and a transistor connected in series between an output of the controllable current source and a point of DC reference voltage, said transistors having a control electrode coupled to the output of the differential amplifier.

11. A fullwave rectifier circuit as claimed in claim 10 wherein said rectifier stage includes a second transistor coupled between said signal input and said signal output, and means coupling a control electrode of the second transistor to a node between said diode element and the first transistor.

12. A fullwave rectifier circuit as claimed in claim 1 wherein said differential amplifier comprises first and second transistors each having a first main electrode coupled in common to one terminal of a source of direct voltage and each having a second main electrode coupled via respective first and second branches of a further current mirror to a second terminal of said source of direct voltage.

* * * * *